United States Patent [19]
Kawano

[11] Patent Number: 5,986,320
[45] Date of Patent: Nov. 16, 1999

[54] SEMICONDUCTOR INTEGRATED CIRCUIT DEVICE

[75] Inventor: Kenji Kawano, Tokyo, Japan

[73] Assignee: Mitsubishi Denki Kabushiki Kaisha, Tokyo, Japan

[21] Appl. No.: 09/044,002

[22] Filed: Mar. 19, 1998

[30] Foreign Application Priority Data

Mar. 10, 1998 [JP] Japan .................................. 10-057823

[51] Int. Cl.⁶ .......................... H01L 29/00; H01L 27/10; H01L 27/108
[52] U.S. Cl. .......................... 257/529; 257/209; 257/296
[58] Field of Search .................................. 257/529, 209, 257/369, 290, 906, 908, 296

[56] References Cited

U.S. PATENT DOCUMENTS 5,373,476  12/1994  Jeon ......................................... 257/369
5,870,329  2/1999   Foss ......................................... 257/908

FOREIGN PATENT DOCUMENTS 0275752   7/1988   European Pat. Off. .
0469252   2/1992   European Pat. Off. .
61-30044  2/1986   Japan .
4-293247  10/1992  Japan ..................................... 257/906
547862    2/1993   Japan .
6-69446   3/1994   Japan ..................................... 257/906

Primary Examiner—Mahshid Saadat
Assistant Examiner—J. B. Clark
Attorney, Agent, or Firm—Leydig, Voit & Mayer, Ltd.

[57] ABSTRACT

A method of testing a semiconductor integrated circuit device including a defective chip recognition circuit unit so that in testing a DPAM unit, if the DRAM unit cannot be made to conform to a specification, even using a redundancy circuit, defective data can be written in the defective chip recognition circuit unit. The method includes deciding whether a DRAM unit conforms and deciding whether a DRAM unit judged imperfect can be conformed using a redundancy circuit; deciding whether the semiconductor integrated circuit device is defective when the DRAM unit has been judged defective and writing the defective decision data into a defective chip recognition circuit unit; reading the defective decision data in the defective chip recognition circuit unit and deciding whether to test the logic unit; testing the logic unit when the test of the logic unit is to be performed; and deciding whether the logic unit conforms.

6 Claims, 12 Drawing Sheets

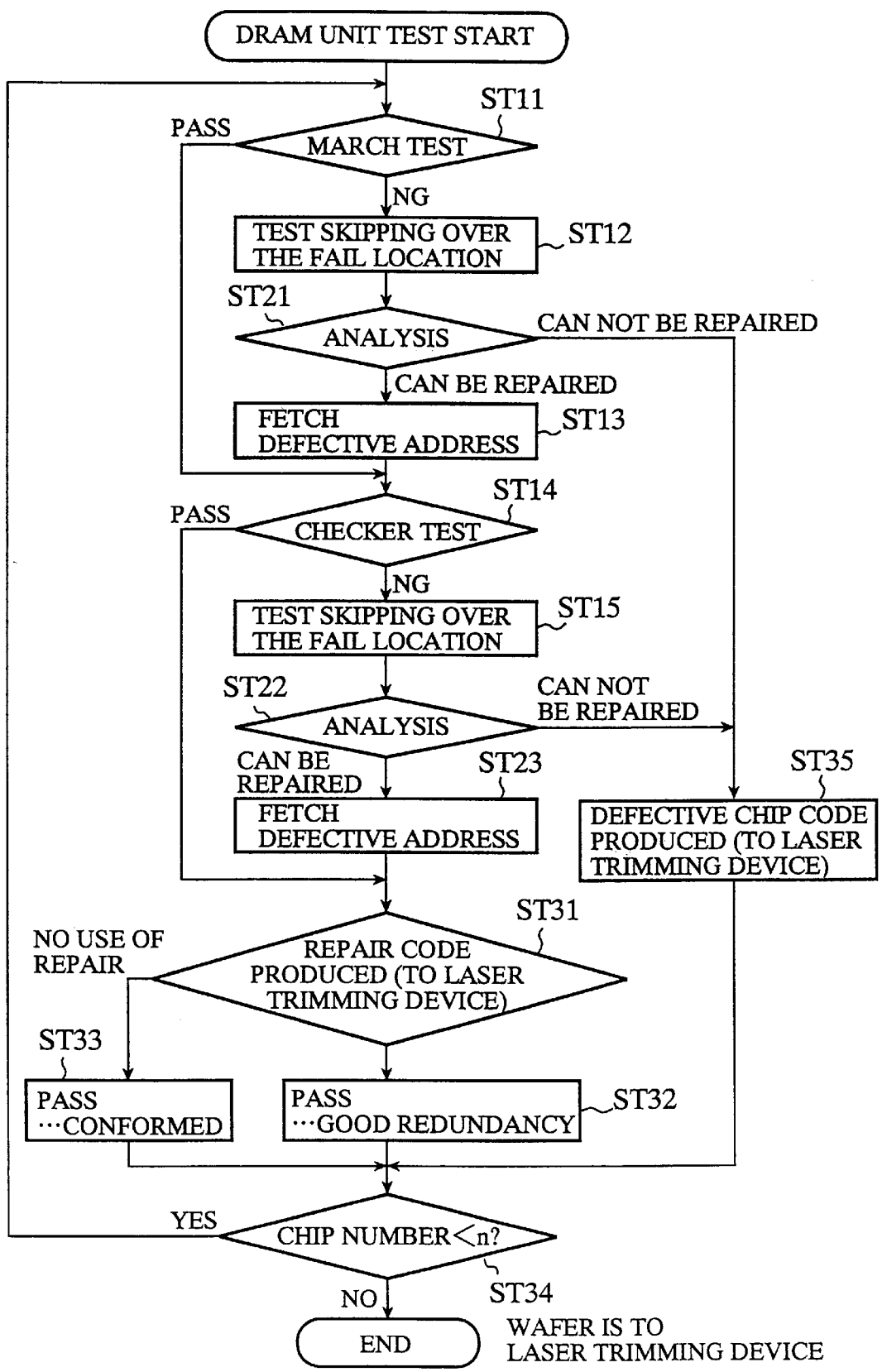

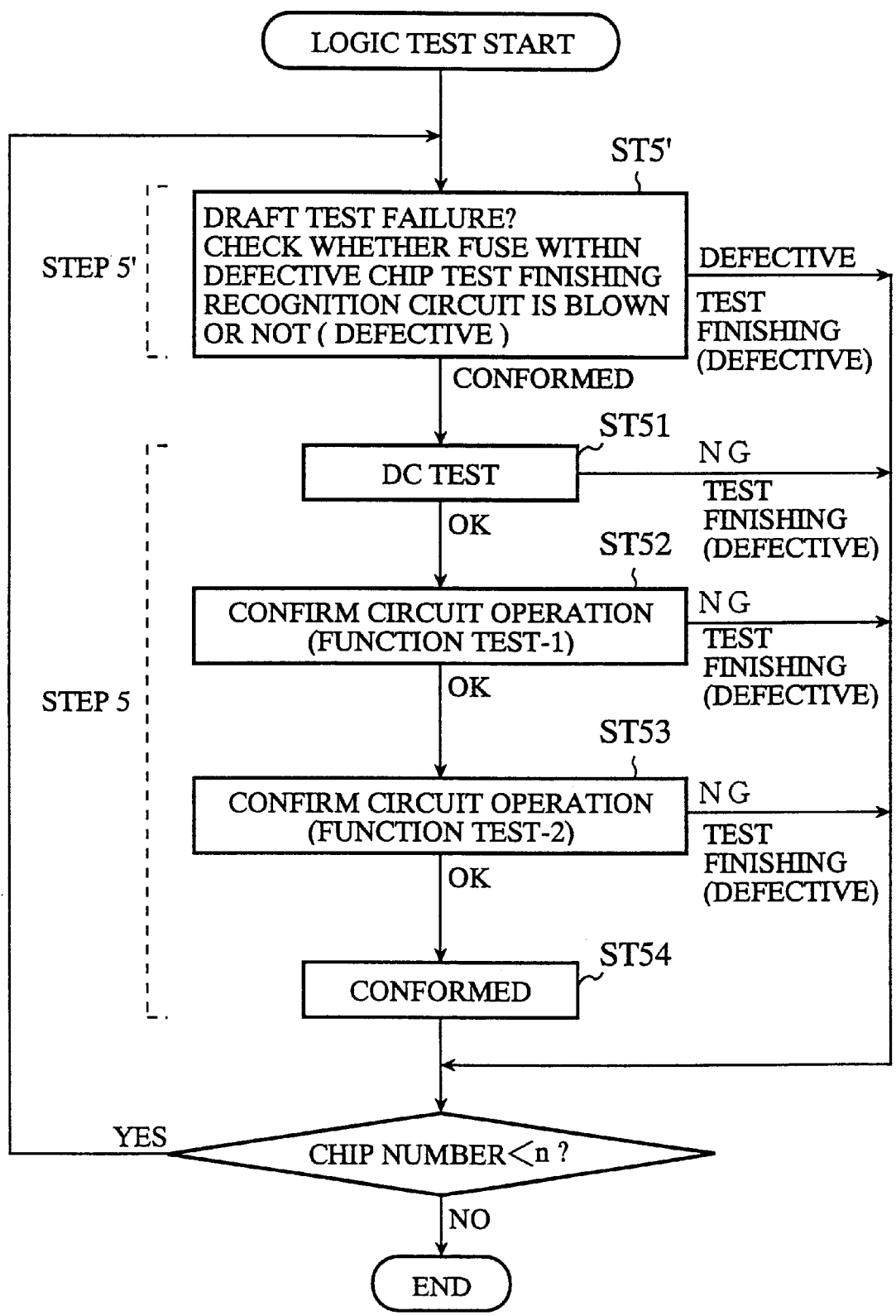

SEMICONDUCTOR INTEGRATED CIRCUIT DEVICE

BACKGROUND OF THE INVENTION

1. Field of the Invention

The present invention relates to semiconductor integrated circuit devices and a method of testing the same, and more specifically relates to a semiconductor integrated circuit device and a method of testing the same, wherein a test flow effecting decision as to whether a semiconductor integrated circuit device, such as an LSI chip conforms or is defective in a wafer test, and a defective article recognition circuit for realizing the test flow are provided.

2. Description of the Prior Art

In recent years, in the field of multimedia equipments, for data processing of high degree attendant on processing of digital signals, devices of high performance have been required. On the other hand, in order to meet request of portability, specification which can not be easily attained by conventional semiconductor products is required in that semiconductor devices must be of small size and low consumption power. For such request, in order to intend low consumption power of a system and to reduce a board area, a hybrid IC such as a DRAM containing logic IC (hereinafter referred to as "eRAM (embedded RAM) logic IC") in which DRAM and logic are formed in the form of one chip has been developed. The logic generally means a logic circuit where inputted data are subjected to logic operation and outputted, and in the logic of eRAM type, the operation result at the midway of the logic operation is once stored in the DRAM and the stored operation result is drawn afterward and subjected to the operation processing.

When such a hybrid IC is manufactured, a wafer test must be performed so as to effect decision that IC is conformed or defective before the shipment.

In general, a chip judged defective in the wafer test is marked with ink and then advanced to assembly in next process, and in the case of the hybrid IC, the DRAM unit and the logic unit must be tested in wafer test respectively. This is because a tester used in testing a general-purpose DRAM is different from that used in testing a logic IC, and in similar manner to this, in order to test the DRAM unit or the logic unit individually in the above-mentioned eRAM, the DRAM unit and the logic unit must be tested using individual testers.

When the DRAM unit and the logic unit are tested, if the ink marking to the defective chip is executed at finishing of test of either unit, a problem is produced that a wafer jig (probe card) may be flawed at testing of another unit. For example, consider that the test is performed in the order of the test of the DRAM unit and the test of the logic unit. Here the probe card is allowed to contact a needle being a part thereof with a pad within a chip and thereby performs test in giving an electric signal.

SUMMARY OF THE INVENTION

Since a semiconductor integrated circuit device and a method of testing the same in the prior art are constituted as above described, a chip judged defective in the test of the DRAM unit is once marked with ink by a tester for the DRAM unit. Then if the ink mark is shifted from the specified position and the ink flows to the upper side of the pad, there is a problem that the needle portion of the probe card may be broken when the tester is exchanged and the logic unit is tested.

Also a chip judged defective in the test on one hand (test of the DRAM unit or test of the logic unit) is only marked with ink and can appeal to the visual sensation. However, the tester at present can not recognize the ink mark and not effect decision that the chip is defective and need not be tested. Since the chip judged defective in the test on one hand may be tested again in the test on the other hand, there is a problem that the useless test time is required and the test time becomes long.

Since the logic IC or the general-purpose DRAM is originally judged conformed or defective using one tester, the above-mentioned problems can not be produced.

In order to solve the above-mentioned problems, an object of the present invention is to provide a semiconductor integrated circuit device and a method of testing the same, wherein a wafer test flow and a defective chip recognition unit to realize the test flow are provided.

In a semiconductor integrated circuit device according to the present invention, a DRAM unit and a logic unit are incorporated on the same semiconductor substrate and connected to each other, and a defective chip recognition circuit unit is provided so that at the time of testing the DRAM unit, if decision is effected that the DRAM unit can not be made conformed even by using a redundant circuit, the defective data is written in the defective chip recognition circuit. As a result, if the defective data are recognized at the previous stage of the test of the logic unit, since the chip judged defective in the test of the DRAM unit is not tested in the logic unit and the test can be finished, there is an effect that the unnecessary test time can be reduced.

Moreover, if a chip is defective in the test of the DRAM unit and judged conformed in the test of the logic unit, since the chip does not flow to assembly process being next process, there is an effect that the unnecessary cost can be reduced.

In a semiconductor integrated circuit device according to the present invention, the defective chip recognition circuit unit is formed on a surface of a semiconductor substrate, and has a defective chip recognition fuse and two pads connected externally on both ends of the defective chip recognition fuse respectively. As a result, since the defective chip recognition fuse can be deemed as a sort of resistance, a current flowing through the resistance between the two pads is measured and decision can be effected regarding whether the defective chip recognition fuse is blown out or not. Since the logic unit is not tested and the test can be finished, there is an effect that the above-mentioned unnecessary test time and the cost can be reduced.

In a semiconductor integrated circuit device according to the present invention, the defective chip recognition circuit unit is formed on a surface of a semiconductor substrate and has a defective chip recognition fuse and two pads connected externally on both ends of the defective chip recognition fuse respectively, and one of both ends is connected to the power source wiring within the chip and other end is connected to the pad. As a result, similar effect to the above-mentioned effect can be obtained and also there is an effect that the number of pad can be reduced.

In a semiconductor integrated circuit device according to the present invention, the defective chip recognition circuit unit is formed on a surface of a semiconductor substrate, and has a defective chip recognition fuse and two pads connected externally on both ends of the defective chip recognition fuse respectively, and one of both ends is connected to the GND wiring within the chip and other end is connected to the pad. As a result, similar effect to the above-mentioned effect can be obtained and also there is an effect that the pad number can be reduced.

In a semiconductor integrated circuit device according to the present invention, a redundancy fuse is included in a DRAM unit, and the redundancy fuse and a defective chip recognition fuse are made of the same material. As a result, since both fuses can be blown out in the same process, there is an effect that it can contribute to the process saving.

In a semiconductor integrated circuit device according to the present invention, a redundancy fuse and a defective chip recognition fuse are made of the same material formed in the same process. As a result, there is an effect that it can contribute to the saving of the number of process.

A method of testing a semiconductor integrated circuit device according to the present invention comprises a first step of effecting decision whether a DRAM unit is perfectly conformed or not, and effecting decision whether the DRAM unit judged imperfectly conformed can be made conformed or not using a redundancy circuit; a second step of effecting decision that the semiconductor integrated circuit device is defective, when the DRAM unit is judged defective in the first step, and writing the defective data into a defective chip recognition unit; a third step of reading the defective decision data in the defective chip recognition circuit and effecting decision whether test of the logic unit is performed or not; a fourth step of performing the test of the logic unit, when the decision is effected in the third step that the test of the logic unit is to be performed; and a fifth step of effecting decision whether the logic unit is conformed or not. As a result, since not only the unnecessary test of the logic unit is not performed in the fourth step but also a defective chip judged defective in the test of the DRAM unit and judged conformed in the test of the logic unit does not flow in the assembly process after finishing the test, there is an effect that the unnecessary test time can be reduced and also the unnecessary process cost can be reduced.

A method of testing a semiconductor integrated circuit device according to the present invention further comprises a sixth step of applying a mark of a defective article to the semiconductor integrated circuit device judged defective in the second step and the fifth step. As a result, since the defective article after the test of the DRAM unit need not be marked, there is an effect that when a mark is given by an ink mark or the like and spreads to the upper side of the pad of the chip due to the position shift, the needle portion of the probe card is prevented from being broken during testing the logic unit.

In a method of testing a semiconductor integrated circuit device according to the present invention, the defective chip recognition circuit unit is formed on a surface of a semiconductor substrate and has a defective chip recognition fuse and two pads connected externally on both ends of the defective chip recognition fuse respectively, and when the defective chip decision data in the second step are written, the defective chip recognition fuse is blown out, and when the defective chip decision data in the third step are read, decision is effected depending on whether a current flows or not between the two pads. As a result, there is an effect that the needle of the probe card similar to that above described can be prevented from being broken.

In a method of testing a semiconductor integrated circuit device according to the present invention, the defective chip recognition fuse is blown out by the laser trimming. As a result, since the blowing-out of the fuse can be performed together with a redundancy fuse included in a redundancy circuit unit, there is an effect that the process cost can be reduced.

BRIEF DESCRIPTION OF THE DRAWINGS

FIG. 12 is a test flow chart executed in test of a DRAM unit of a semiconductor integrated circuit device according to the first embodiment of the invention;

FIG. 13 is a test flow chart executed in test of a logic unit of a semiconductor integrated circuit device according to the first embodiment of the invention;

DETAILED DESCRIPTION OF THE PREFERRED EMBODIMENTS

Embodiments of the present invention will be described referring to the accompanying drawings as follows.

First Embodiment

Figure 1:
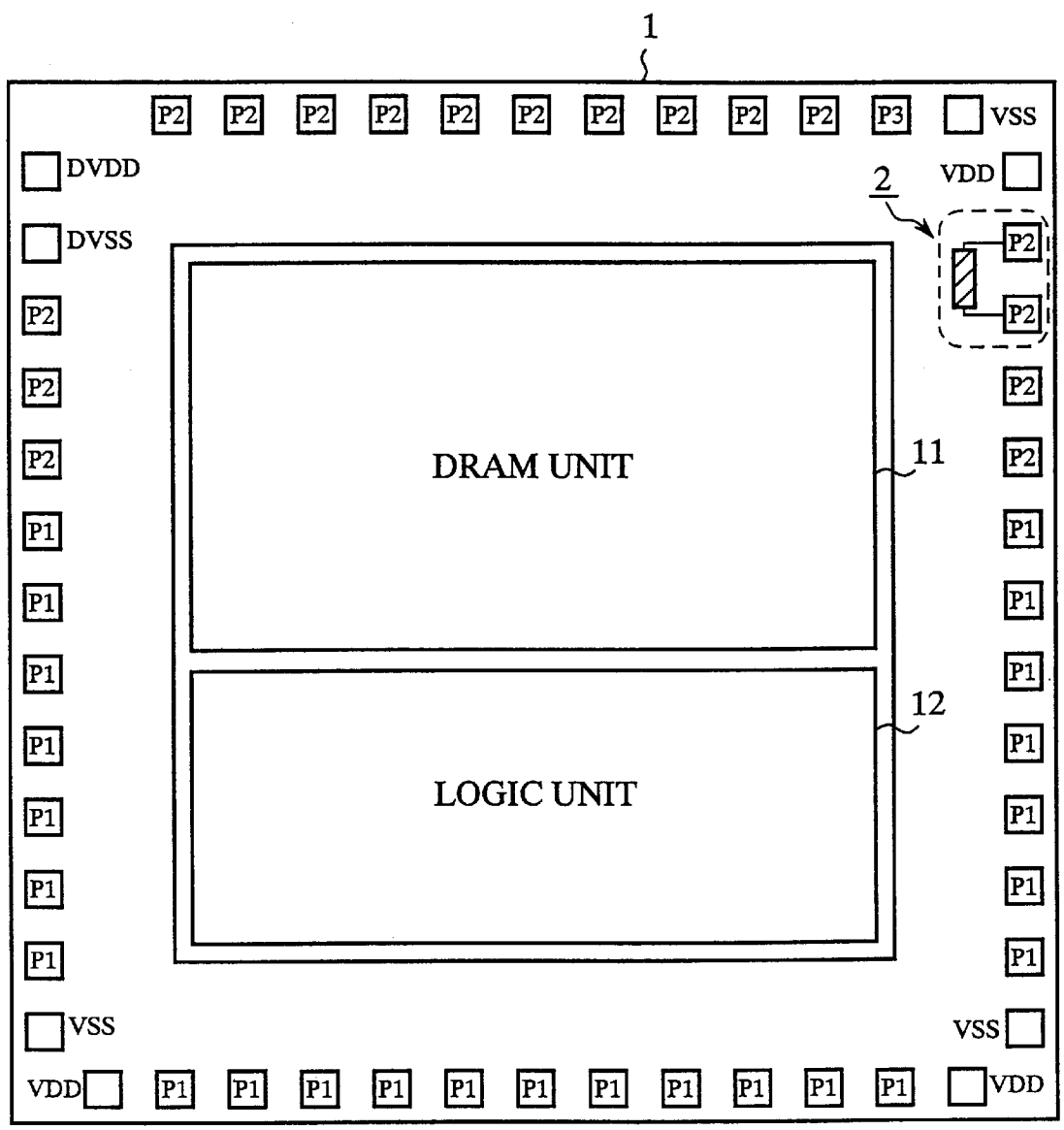
FIG. 1 is a chip layout diagram showing an example of whole configuration of a semiconductor integrated circuit device of eRAM type according to a first embodiment of the invention.

FIG. 1 is a chip layout diagram showing an example of whole configuration of a semiconductor integrated circuit device of eRAM type according to a first embodiment of the present invention. In FIG. 1, numeral 1 designates a semiconductor substrate, numeral 2 designates a defective chip recognition circuit unit, numeral 11 designates a DRAM unit, and numeral 12 designates a logic unit. P1 and P2 designate pads to enable signal inputting to the logic unit and also to enable signal outputting from the logic unit, and P3 designates a pad to enable signal inputting to the DRAM unit only. Also in FIG. 1, VDD and VSS designate a logic unit a power source pad and a ground potential pad respectively, and DVDD and DVSS designate a DRAM unit power source pad and a ground potential pad respectively. Among the above-mentioned pads, the pad P2, the pad P3, the pad VDD, the pad VSS, the pad DVDD and the pad DVSS are pads necessary to execute the DRAM unit test as described later, and the above-mentioned all pads are necessary for the logic unit test. In other words, all pads are not always necessary for the DRAM unit test.

Figure 2:
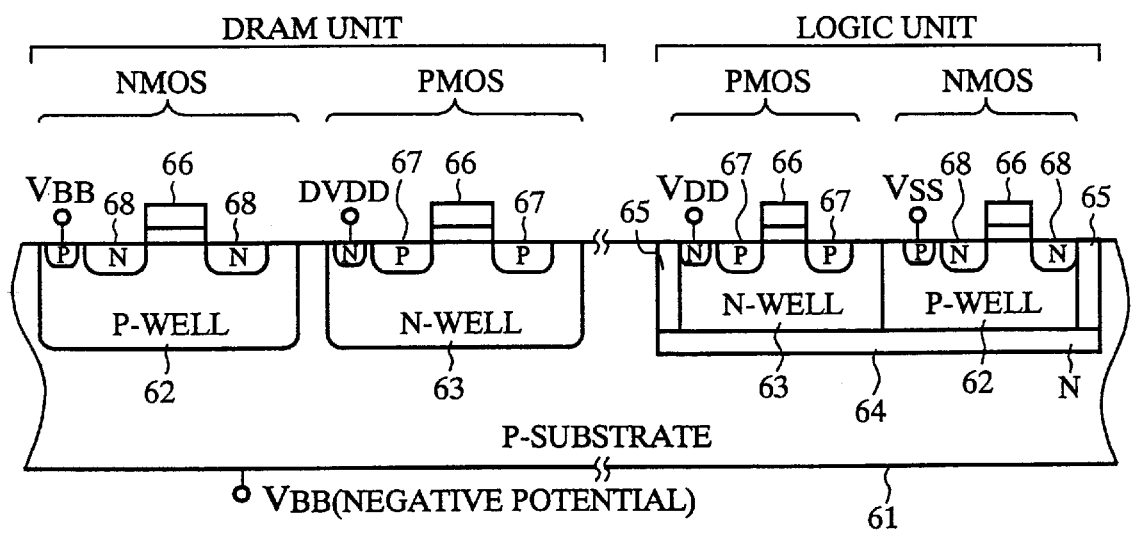
FIG. 2 is a schematic sectional view showing P-MOS, N-MOS formed in a logic unit and a DRAM unit respectively in the semiconductor integrated circuit device of FIG. 1.

FIG. 2 is a schematic sectional view showing P-MOS and N-MOS formed in a logic unit and a DRAM unit respectively in the semiconductor integrated circuit device of FIG. 1. In FIG. 2, numeral 61 designates a p-type semiconductor substrate, numeral 62 designates a P-well region, numeral 63 designates an N-well region, numeral 64 designates a bottom N-well region, numeral 65 designates an N-well wall region, numeral 66 designates a gate electrode, numeral 67 designates source or drain of the P-MOS transistor, and numeral 68 designates source or drain of the N-MOS transistor. Since the substrate potential of the DRAM unit at the left side is VBB potential (negative potential) generated and given in the DRAM circuit, it is electrically separated from the logic unit at the right side by the bottom N-well region 64 and the N-well region 65. That is, so-called triple well structure is formed in the semiconductor integrated circuit device. As a result, mutual interference between the DRAM unit and the logic unit can be suppressed.

Figure 3:
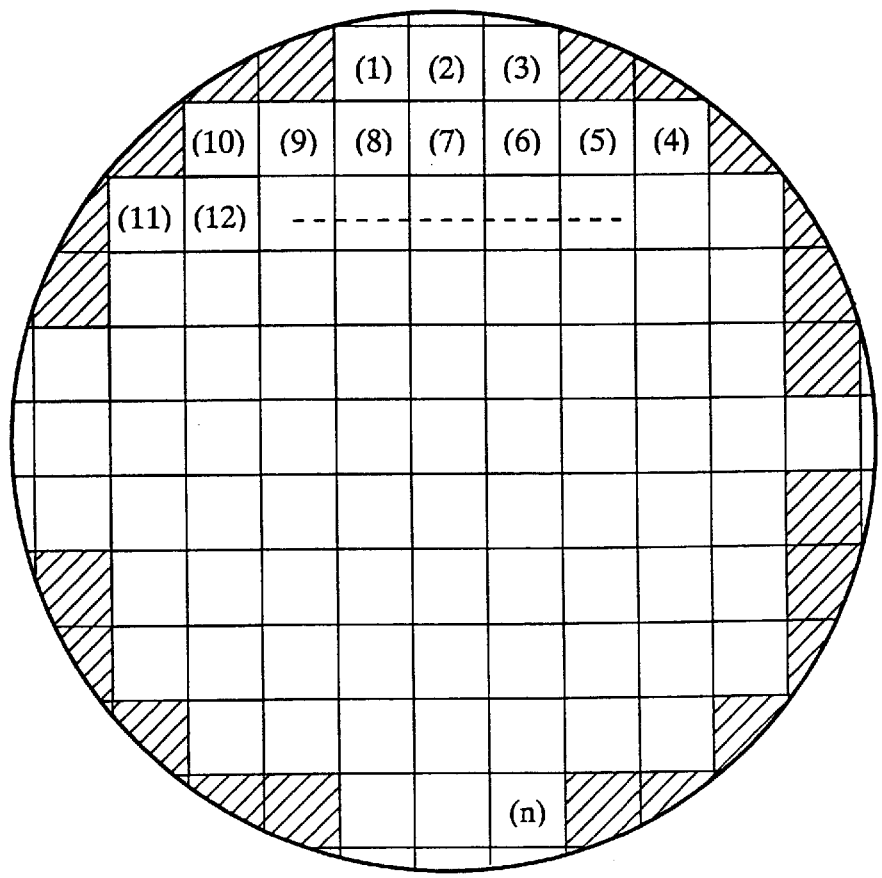
FIG. 3 is a layout diagram showing an example of the wafer test order of a chip assembled on a wafer substrate.
Figure 4A:
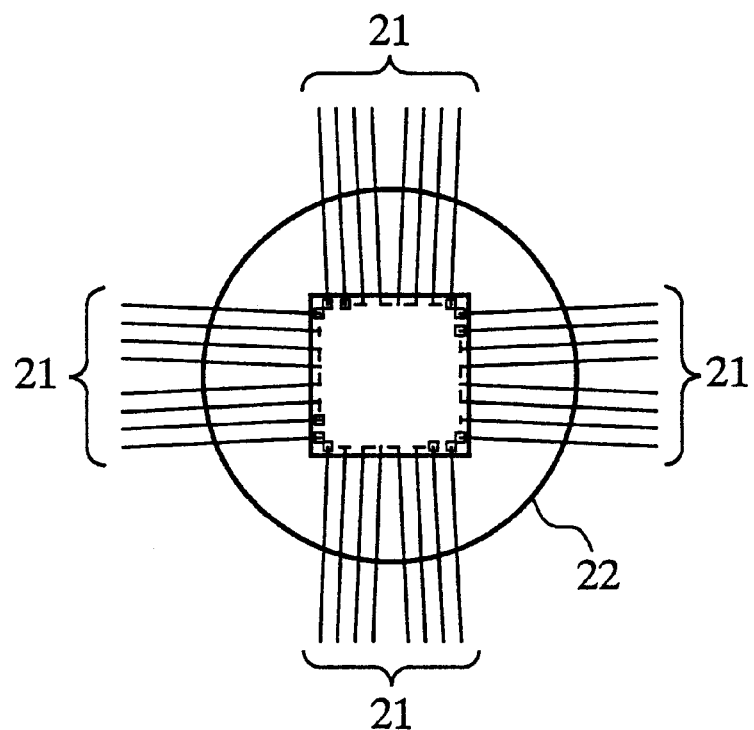
FIG. 4A and FIG. 4B are a plan view and a perspective view respectively showing an example of configuration of a probe card.
Figure 4B:
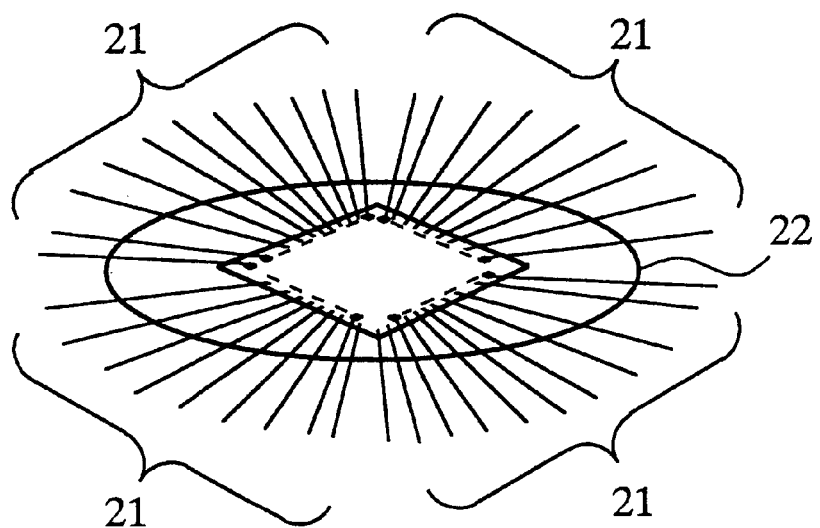

FIG. 3 is a diagram showing an example of the wafer test order of chips produced on the wafer substrate. In FIG. 3, (1) to (n) show the chip number, and the order of the wafer test starts from the (1)-st chip at the left end of the uppermost line of the wafer and advances towards the right direction, and after this line is finished, it is moved to the left end of next lower line and advances similarly and comes to the end at the (n)-th chip. FIG. 4A and FIG. 4B are a plan view and a perspective view respectively of an example of a probe card. In FIG. 4A and FIG. 4B, numeral 21 designates a probe needle and numeral 22 designates a card substrate. The top end portion of the probe needle 21 at the inside of the card substrate 22 abuts on pads P1 to P3 and becomes conductive and contacts with the tester of DRAM or logic through the tip end portion at the outside.

Figure 5A:
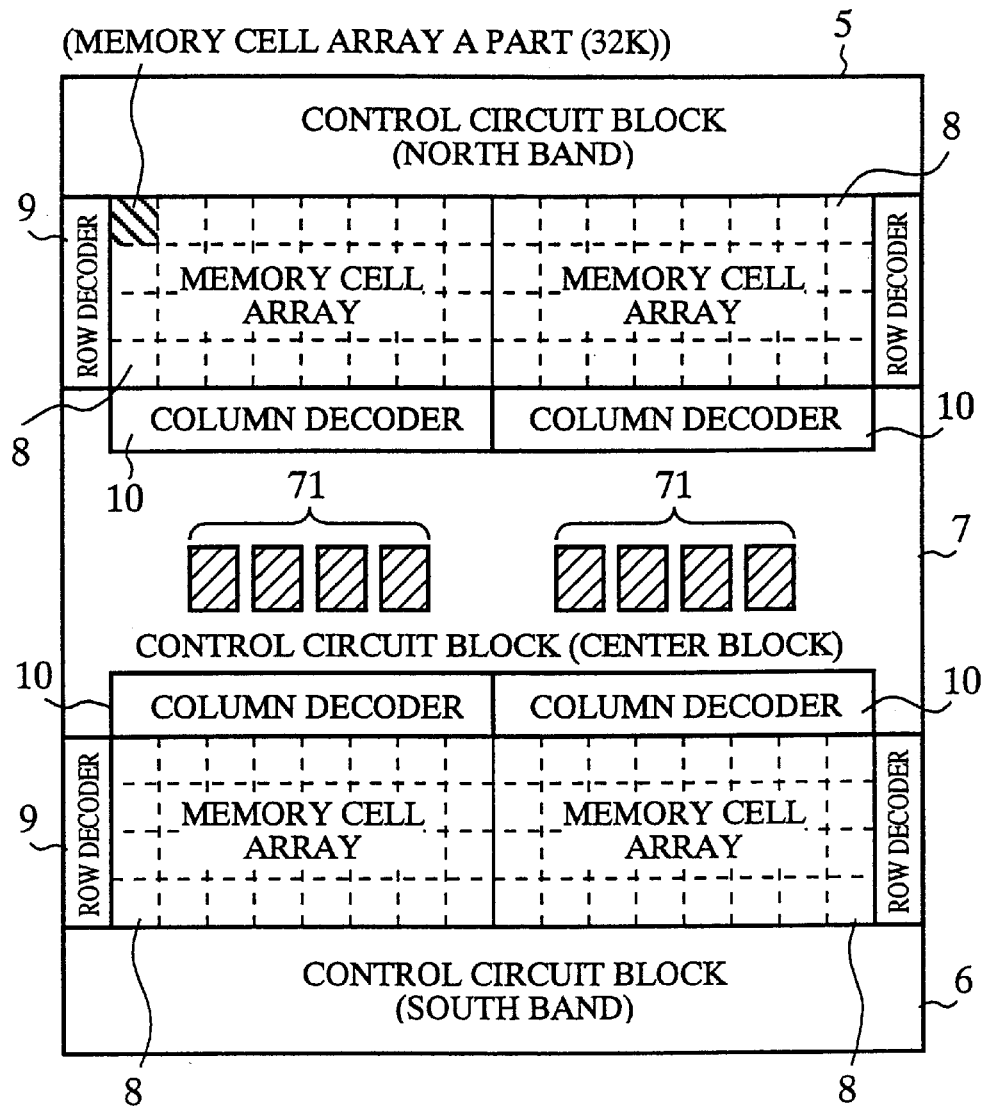
FIG. 5A and FIG. 5B are a layout diagram showing an example of configuration of a DRAM cell of a semiconductor integrated circuit device and a configuration diagram of one memory cell respectively.
Figure 5B:
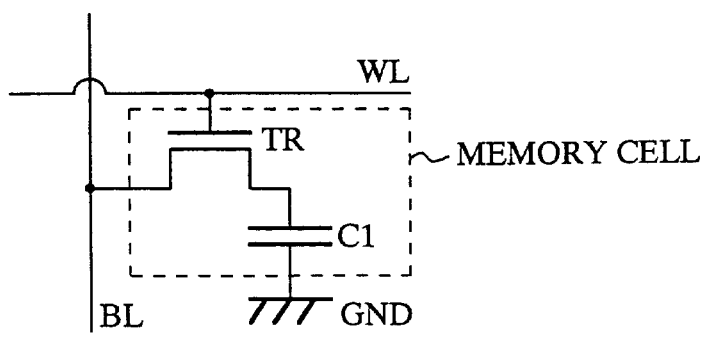
Figure 6:
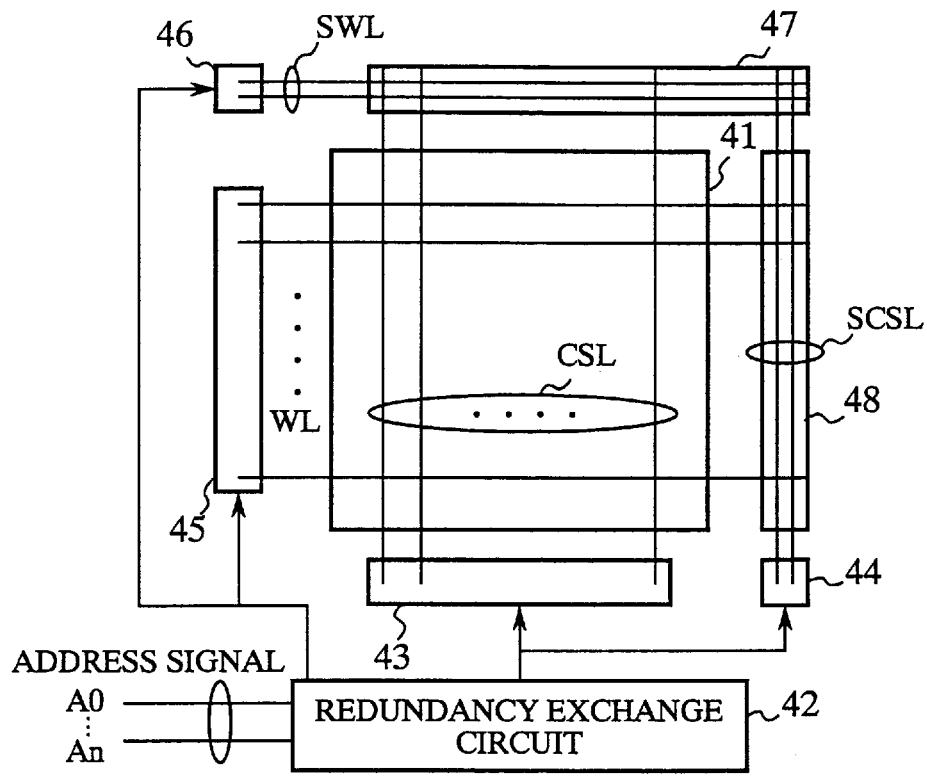
FIG. 6 is an explanation diagram showing relation of a redundancy exchange circuit and a memory cell array.
Figure 7A:
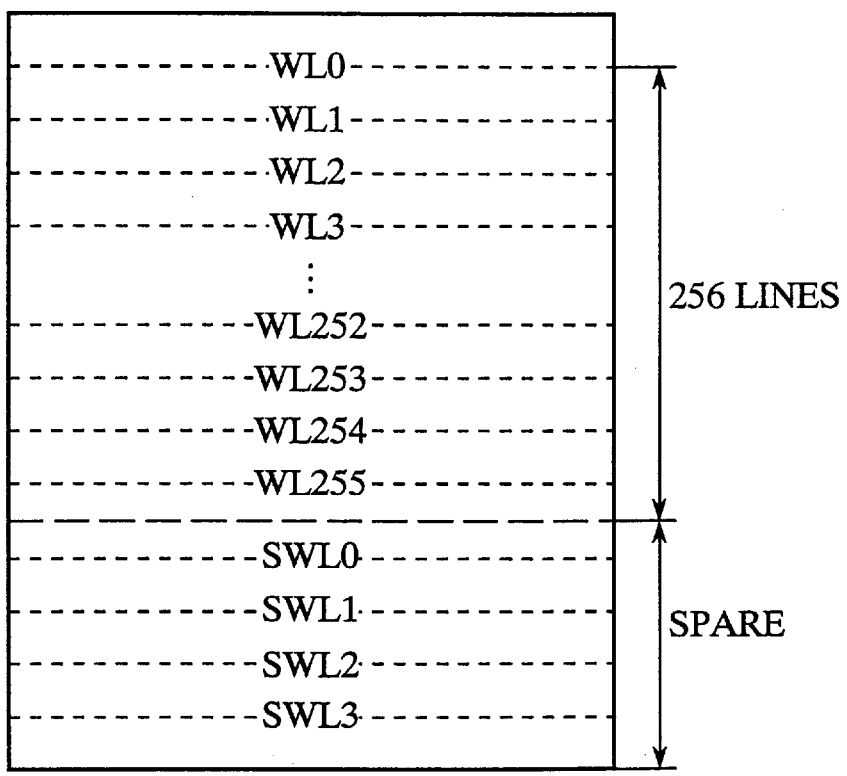
FIG. 7A and FIG. 7B are a row address diagram and a column address diagram respectively showing configuration of a memory cell array of A part in FIG. 5.
Figure 7B:
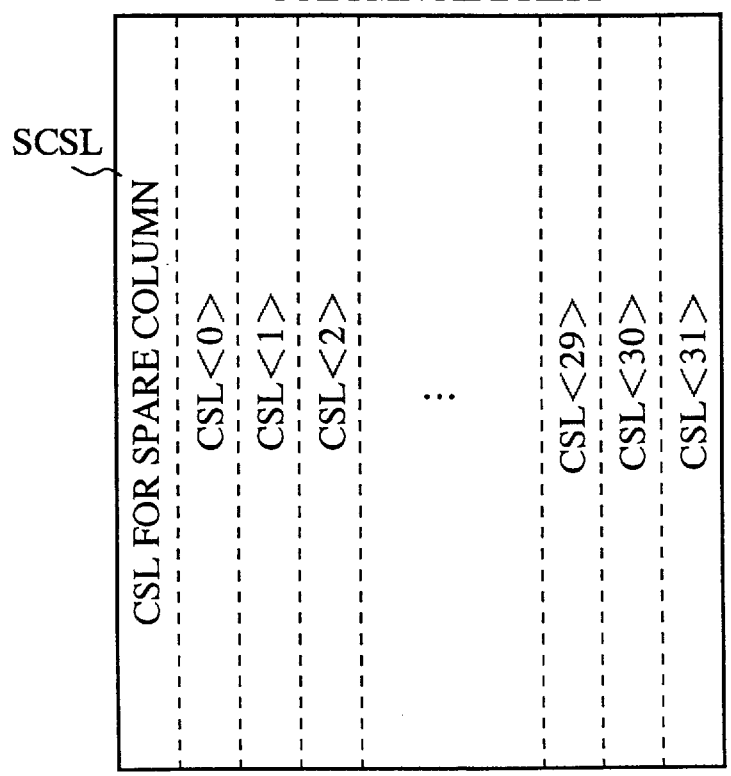

FIG. 5A and FIG. 5B are a layout diagram showing an example of configuration of a DRAM cell and a configuration diagram of one memory cell respectively, and FIG. 6 is an explanation diagram showing relation of the redundancy exchange circuit and the memory cell array. FIG. 7A and FIG. 7B are layout diagrams of row address and column address respectively showing configuration of a memory cell in A part of a memory cell array in FIG. 5.

In the figures, numeral 5 designates a first control circuit block called North band, numeral 6 designates a second control circuit block called South band, numeral 7 designates a Center block including a redundancy control circuit for controlling a redundancy circuit and a fuse for replacement thereof, numeral 8 designates a memory cell array block comprising DRAM, and numeral 71 designates a fuse circuit block.

Also numeral 41 designates a memory cell array, numeral 42 designates a redundancy exchange circuit, numeral 43 designates a column decoder connected to a bit line 61, numeral 44 designates a redundancy column decoder connected to a redundancy bit line, numeral 45 designates a row decoder connected to a word line, numeral 46 designates a redundancy row decoder connected to a redundancy word line, and A0 to An designate address signals. WL0 to WL255 designate 256 row lines, SWL0 to SWL3 designate four spare row lines, CSL designates 32 column lines, and SCSL designates a spare column line.

Figure 8:
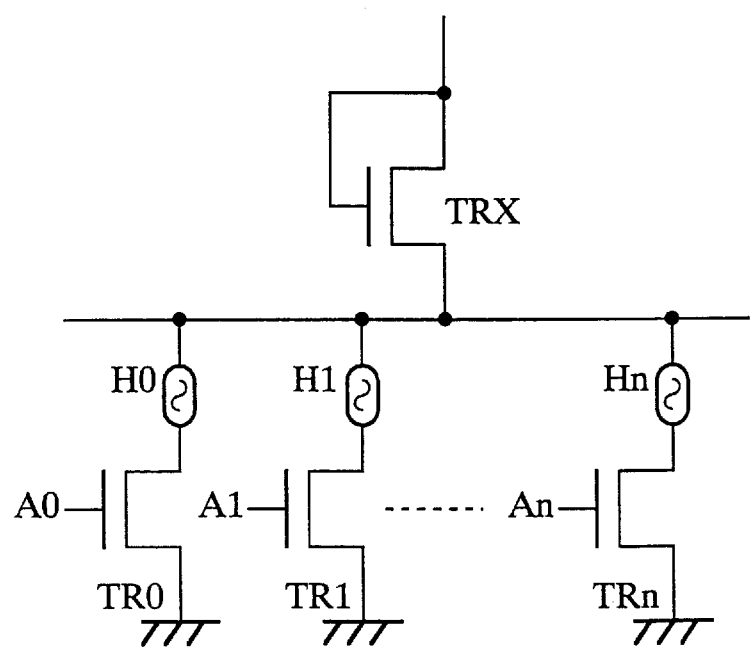
FIG. 8 is a circuit diagram showing a fuse element unit.

FIG. 8 is a circuit diagram showing a fuse element unit included in the redundancy exchange circuit 42 and comprising transistors TR0 to TRn having the drain side connected through fuse elements H1 to Hn and the source side connected to the earth respectively.

For example, an address signal A0 is inputted to the redundancy exchange circuit 42 and passes through an identity circuit, and an exchange signal is sent out through an address storage unit previously programmed so that the address signal A0 is subjected to the redundancy exchange if the identity to the address signal A0 exists. That is, unless the fuse element H0 in the address storage unit is subjected to the laser trimming and becomes conductive, since the potential at the drive side is not lowered even if the gate of the transistor TR0 becomes H level by the address signal A0, the redundancy is recognized thereby the exchange signal is sent out. The redundancy row decoder is activated at the row decoder side whereas the redundancy column decoder is activated also at the column decoder side. As a result, it follows that the defective portion of the memory cell is subjected to the redundancy.

Figure 9:
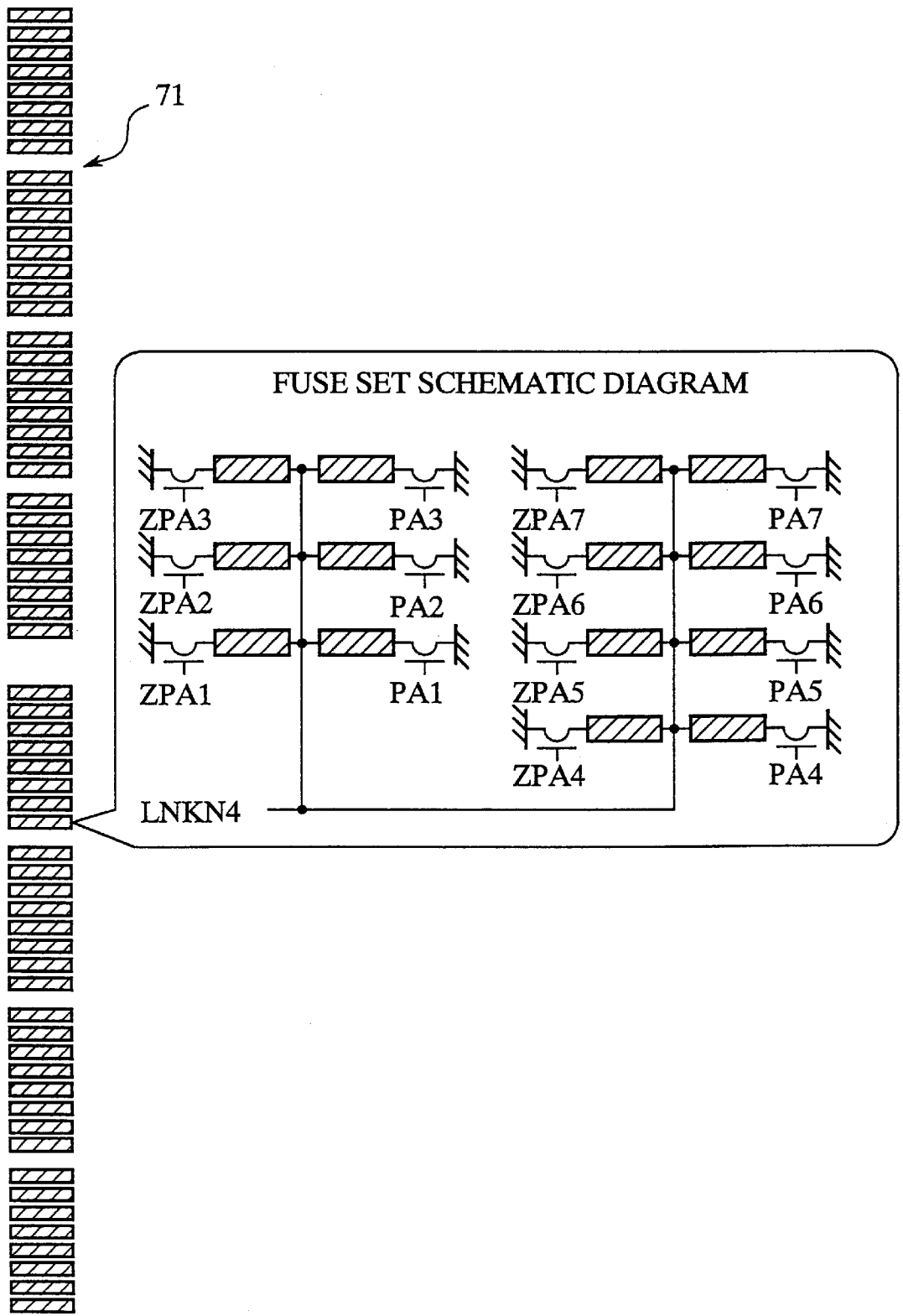
FIG. 9 is an enlarged view of a fuse circuit block;.

Also FIG. 9 is a fragmentary enlarged view of a fuse circuit block 71, which becomes a redundancy exchange circuit of a memory cell having a plurality of memory cell arrays.

Figure 10:
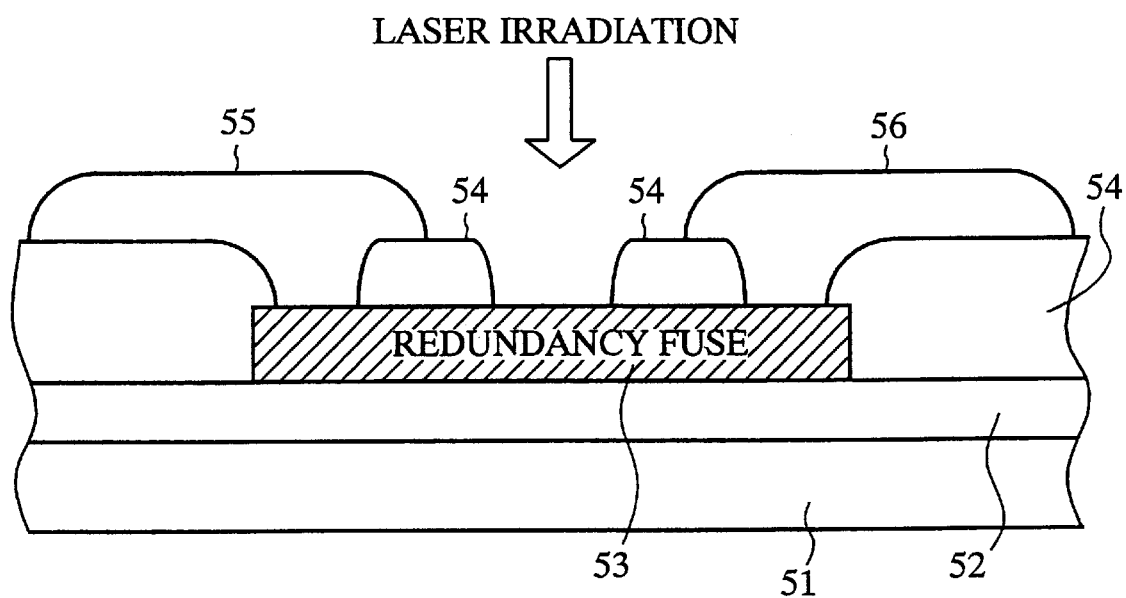
FIG. 10 is a longitudinal sectional view of a fuse element.

FIG. 10 is a longitudinal sectional view of a fuse element used in a redundancy circuit. In FIG. 10, numeral 51 designates a semiconductor substrate, numeral 52 designates an insulation layer such as an oxide film, and numeral 53 designates a redundancy fuse constituted by a polyside or polycrystalline silicon layer or the like being a constitution location of the fuse to be blown out. Numeral 54 designates a passivation film, and numerals 55, 56 designate metal wirings both made of aluminum and connected to independent pads respectively. The laser beam is irradiated from the arrow direction towards the redundancy fuse 53 so that the fuse element is blown out, and thereby the laser trimming is finished.

In addition, the fuse element is applied to a redundancy fuse used in the above-mentioned fuse circuit block 71 or a defective chip recognition fuse as described later.

In the test of the DRAM unit, in order to confirm the operation, test items similar to that executed in a general-purpose DRAM, for example, March or Checker test, are executed.

Here, the march test is a test that, for example, "0" data are written in all memories, and the storage contents being "0" are all read out and the data being "0" become acceptance. Also the checker test is a test that, for example, based on patterns having lattice shape, "0", "1" data are written in all memories and the storage contents are read out and it is checked whether the storage contents are coincident with the written patterns or not.

Also in similar manner to that done in a general-purpose DRAM, in the semiconductor integrated circuit device, a redundancy circuit (above-mentioned spare row line, spare column line) provided within the DRAM circuit is used, and a defective circuit is replaced by the redundancy circuit, and process flow to improve the conformed article acquisition ratio, i.e., the yield, is executed.

On the other hand, in the test of the logic unit, the function test is executed to confirm the circuit operation or the DC test is executed to confirm the characteristics of individual cells. Moreover in the test of the logic circuit, since the signal processing in the DRAM unit enters, the synthetic function test including the DRAM cell is executed. Here the function test is a test that when some input data enter the logic circuit, it is checked whether the operation result is coincident with the expected value or not.

Items to be tested in the DRAM tester are various, but in this case, the tests in two items, march, checker patterns as above described are executed, and the decision that an article is conformed or defective will be described as an example.

Figure 11:
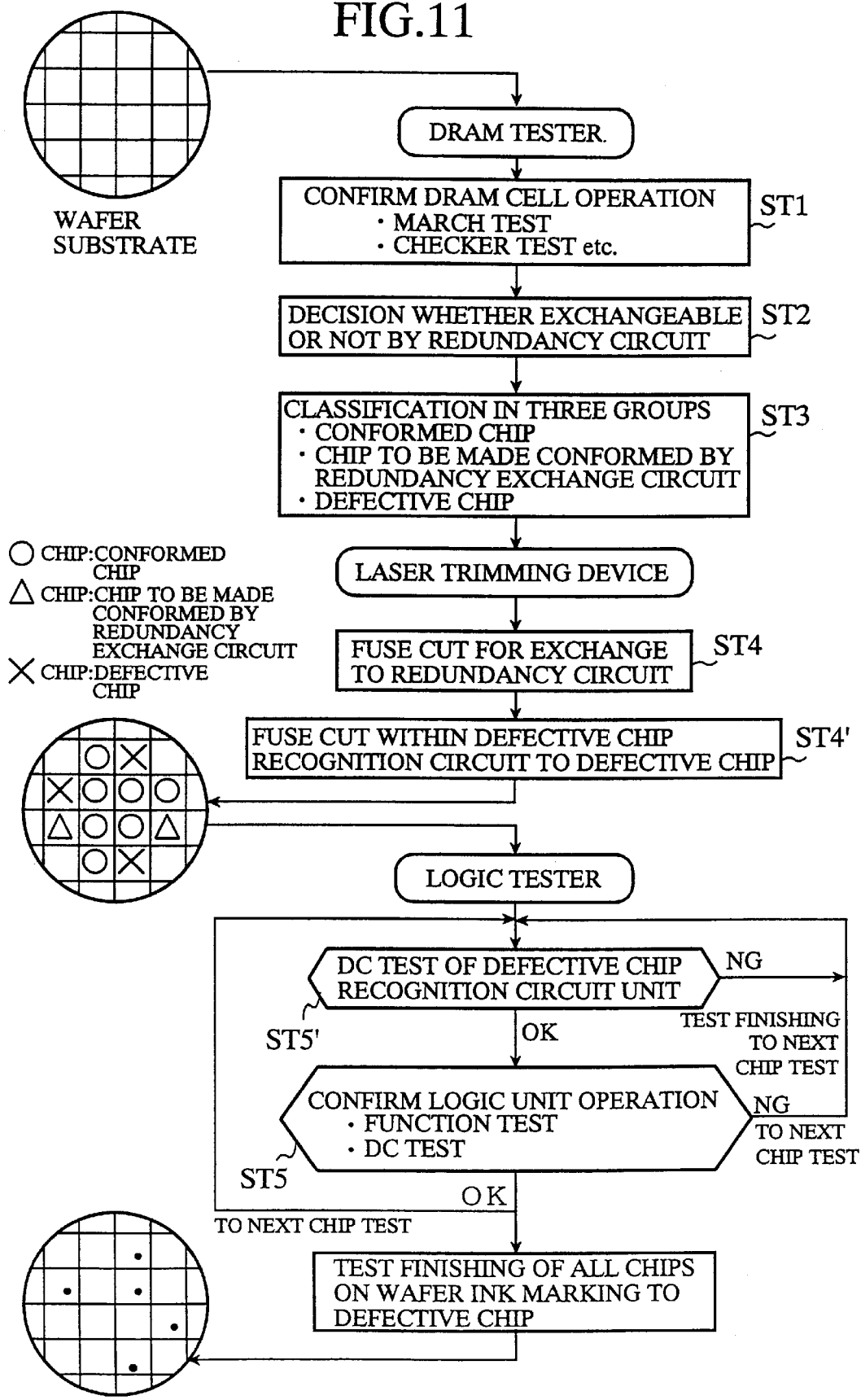
FIG. 11 is a test flow chart of a test method of a semiconductor integrated circuit device according to the first embodiment of the invention.

Step 1 (ST1) in FIG. 11 is directed to the confirmation of the operation in the DRAM cell, and the march test and the checker test are executed. Here in these tests, for chips on the wafer as shown in FIG. 3, the tests are executed in the order of (1), (2), (3) . . . . (n).

Next, the test method of the semiconductor integrated circuit device according to the first embodiment will be described in conjunction with the accompanying drawings.

FIG. 11 is a whole test flow chart showing the test method, FIG. 12 is a test flow chart of a DRAM unit by the test method, and FIG. 13 is a test flow chart of a logic unit by the test method.

In the test of the DRAM unit, in order to confirm the operation, test items similar to that done in a general-purpose DRAM, for example, the march test, the checker test or the like, are executed.

In steps 1 to 3 of FIG. 11, the march test, the checker test and the like are done in the DRAM tester. In order to describe this in detail, referring to FIG. 12, first, the march test is performed (ST11), and if this is passed, process is advanced to the checker test (ST14). On the other hand, if the march test is NG, the test is performed skipping over the fail location (ST12), and analysis is performed regarding whether or not the test result can be repaired, i.e., can be made redundant (ST21). If this can be repaired, the defective address is fetched (ST13), and if this can not be repaired, process is advanced through the defective chip code generating step (ST35) to the chip number reference step ST34.

Next, the checker test is performed (ST14), and if this is passed, process is advanced to the repair code generating step, and if necessary, the repair code is sent to the laser trimming device (not shown) (ST31). On the other hand, if the checker test is NG, the test is performed skipping over the fail location (ST15), and analysis is performed regarding whether or not the test result can be repaired, i.e., can be made redundant (ST22). If this can be repaired, the defective address is fetched (ST23), and if this can not be repaired, process is advanced through the defective chip code generating step (ST35) to the chip number reference step ST34. In addition, in ST23, if decision is effected in "no use of repair", decision is effected that "the DRAM unit is conformed" and process is sent to ST33. On the contrary, if decision is effected in "use of repair", decision is effected that "the DRAM unit is redundant conformed" and process is sent to ST32 and is further sent to the chip number reference step ST34. In the ST34, if the wafer chip number n is attained, process is transferred to inspection of next wafer.

According to the test flow result of the DRAM unit, there may be following five case results.

Case 1: Chip passes both the march test and the checker test.

Case 2: When the march test is executed, chip is defective, but if the defective address is exchanged using the redundancy circuit, decision is effected that the chip becomes conformed, and then the checker test is executed and the chip passes the checker test.

Case 3: When the march test is executed, chip is defective, and the defective address can not be exchanged even if the redundancy circuit is used.

Case 4: Chip passes the march test and is defective in the checker test, but if the defective address is exchanged using the redundancy circuit, decision is effected that the chip passes the checker test.

Case 5: Chip passes the march test and is defective in the checker test, and the defective address can not be exchanged even if the redundancy circuit is used.

Here, in the case 3 and the case 5, decision is effected that the chip is defective.

Among the above-mentioned five cases, regarding chip in the case 2 and the case 4, at the laser trimming device in the flow chart of FIG. 11, it is calculated at the step 4 which fuse should be cut for exchange to the redundancy circuit among fuses provided within the DRAM circuit. As a result of the calculation, the repair code is generated (ST31), and this is sent to the laser trimming device.

Also the defective chip in the case 3 and the case 5 generates the defective chip code to cut the defective chip recognition fuse included in the defective chip recognition circuit unit 2 provided within the chip (ST35), and the defective chip code is sent to the laser trimming device.

Thus information of the fuse cut stored in the DRAM tester is fetched to the laser trimming device as shown in FIG. 11. Corresponding to the five cases as above described, the cutting of the redundancy fuse 53 for exchange to the redundancy circuit or the cutting of the defective chip recognition fuse 33 of the defective chip recognition circuit is executed.

Next as shown in FIG. 11, first, decision is effected in the test of the logic unit regarding whether the object chip is defective (case 3 and case 5) or conformed (step 5') in the test of the DRAM unit. The decision manner in the step 5' is shown in the second embodiment to the fourth embodiment as described later. In this case, decision is effected electrically regarding whether the defective chip recognition fuse 33 is blown out or not.

If the chip is conformed in the step 5', process is advanced to the test to confirm the operation of the logic unit (step 5) and the test is continued. If the chip is defective, the test of the object chip is finished at that time and the test of next chip is started.

In the step 5, in order to confirm the operation of the logic unit, the function test and the DC test are executed. The step 5' and the step 5 are incorporated into one test program to test the logic unit. FIG. 13 shows such an example as a flow chart.

As shown in FIG. 11 to FIG. 13, the step 5 and the step 5' are repeated in all chips on one wafer, and when the test is finished, the ink mark is applied to the defective chip.

As above described, according to the first embodiment, the semiconductor integrated circuit device of eRAM type must be tested using two testers for test of the DRAM unit and test of the logic unit. When the test flow in the first embodiment is not used, that is, if the step 4' and the step 5' do not exist in FIG. 11, since the chip judged defective in the test of the DRAM unit is deemed to be chip of the test object in the test of the logic unit, it follows that all chips on one wafer are tested and the unnecessary test time is produced. This means that when a chip is defective in the DRAM test but judged conformed in the logic test, the defective chip flows to the assembly process being the next process. As a result, the unnecessary cost is increased.

According to the wafer test flow of the semiconductor integrated circuit device, for the defective chip in the test of the DRAM unit, the function test and the DC test are not executed in the test of the logic unit and the test is finished. As a result, there is an effect that the test time can be reduced.

Second Embodiment

Figure 14:
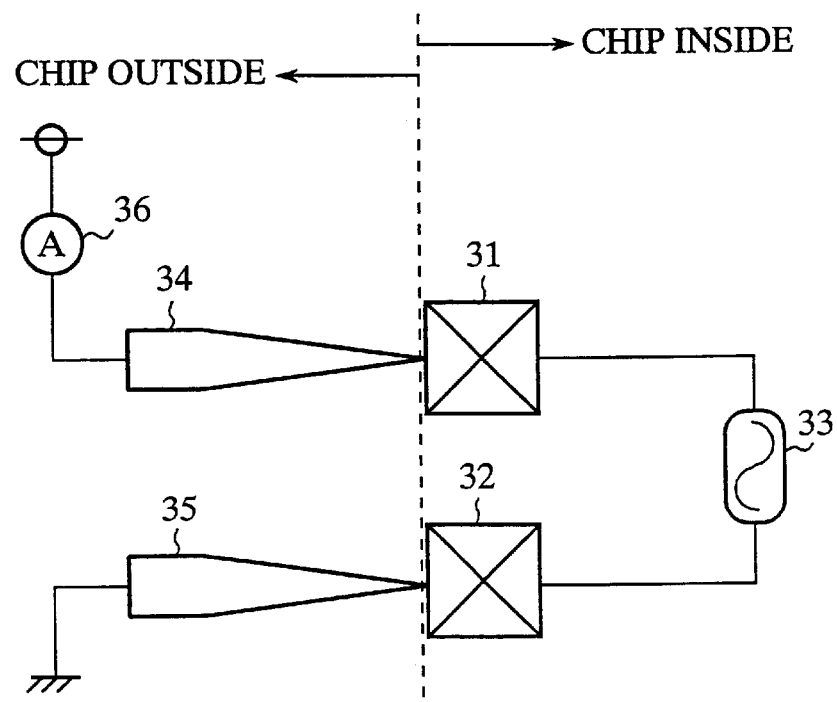
FIG. 14 is a circuit diagram showing configuration of a defective chip recognition circuit unit according to a second embodiment of the invention.

FIG. 14 is a circuit diagram showing configuration of a defective chip recognition circuit unit 2. In FIG. 14, numeral 31 designates one among two pads and numeral 32 designates other pad. Numeral 33 designates chip recognition fuse connected from both pads by wiring. Also numeral 34 designates one of a wafer test probe (needle) (refer to FIG. 4) contacting with either of the pads 31, 32, numeral 35 designates another probe contacting with the other pad, and numeral 36 designates a current detection device, i.e., an ammeter. Any voltage can be applied to the wafer test probe. In this case, one of the pads 31, 32 is connected to the power source wiring, and the other is connected to the earth, i.e., the GND wiring.

The defective chip recognition fuse 33 has configuration similar to the longitudinal sectional view as described in using FIG. 8, and is constituted by polyside or polycrystalline silicon or the like and is formed in the same process as that of the redundancy fuse 53 and can be made of the same material.

Considering that the defective chip recognition fuse 33 is a sort of resistance, a current flowing through the resistance interposed between the two pads is considered as above described, and decision is effected regarding whether or not the defective chip recognition fuse 33 is blown out, in direct current, i.e., in manner of the DC test. In this case, the DC test is performed in that when characteristics of an input buffer are studied, for example, for an input buffer with a pull-up resistor, it is studied whether the approximate value meets the standard requirements or not. Also there are VOH, VOL, for an output buffer, it is studied whether the output current value and voltage value meet the standard requirements or not. In short, it is studied whether the DC value flowing into or drawn out of the pad is the specified value or not.

As above described, since the defective chip recognition fuse 33 together with the redundancy fuse 53 can be formed in the same process and the same material, the defective chip recognition fuse 33 can be cut under the same condition as the cutting of the redundancy fuse 53 for the exchange to the redundancy circuit, that is, using the same laser trimming device.

As above described, according to the second embodiment, since the test flow shown in the first embodiment can be realized, the test time in the wafer test as a whole can be reduced and the above-mentioned effects can be obtained.

Third Embodiment

Figure 15:
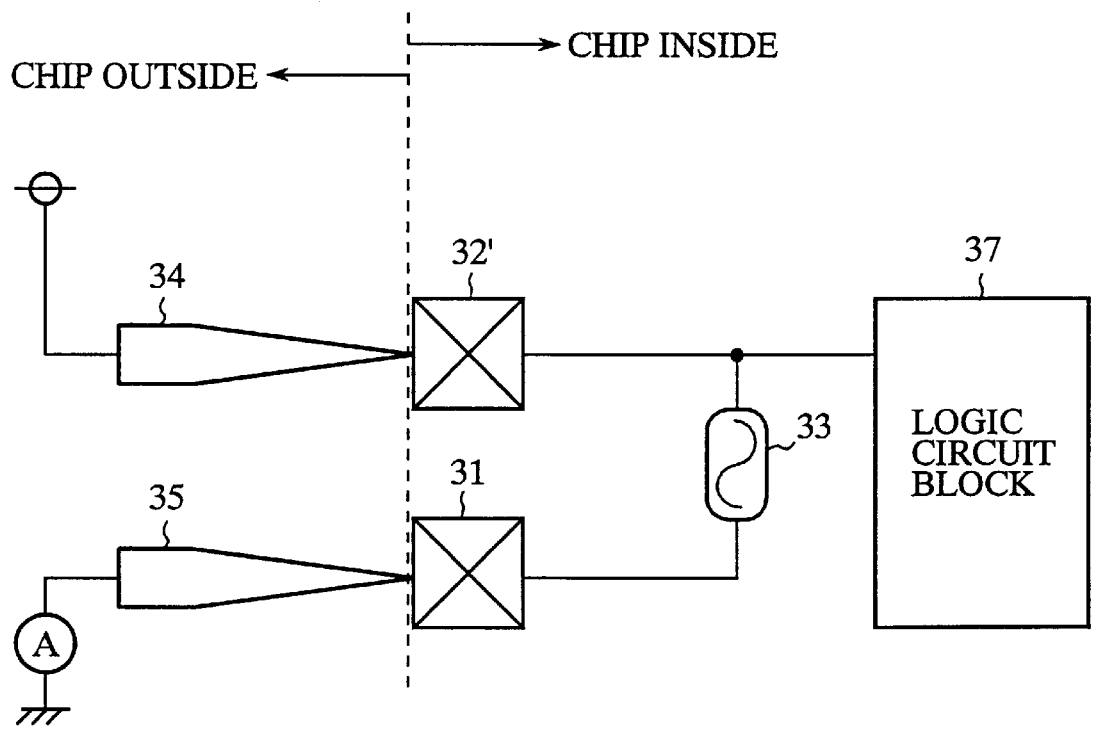
FIG. 15 is a circuit diagram showing configuration of a defective chip recognition circuit unit according to a third embodiment of the invention.

FIG. 15 is a circuit diagram showing another configuration of a defective chip recognition circuit unit 2. In FIG. 15, numeral 31 designates a pad provided newly as a component of the defective chip recognition circuit unit, numeral 32' designates a power source pad previously required, i.e., a pad for the power supply to a logic circuit block 37 in the inside, and numeral 36 designates an ammeter. Numeral 33 designates a fuse, and one end of the fuse 33 is connected to a pad provided newly as a defective chip recognition circuit unit and other end thereof is connected to the power source wiring within the chip. Also numerals 34 and 35 designate one of wafer test probe (needle) contacting with the pads 31, 32'.

The circuit configuration of FIG. 15 receives the power supply from the chip outside of the defective chip recognition circuit unit 2 through the logic circuit block 37 at the chip inside, and is substantially equivalent to that of the second embodiment. A current flowing through a sort of resistance given between the two pads is measured, and a decision is effected whether the fuse is blown out or not.

As above described, according to the third embodiment, since the test flow in the first embodiment can be realized, the wafer test time can be reduced and also one end of the defective chip recognition fuse is connected to the power source wiring within the chip, and an effect can be obtained that the pad can be reduced.

Fourth Embodiment

Figure 16:
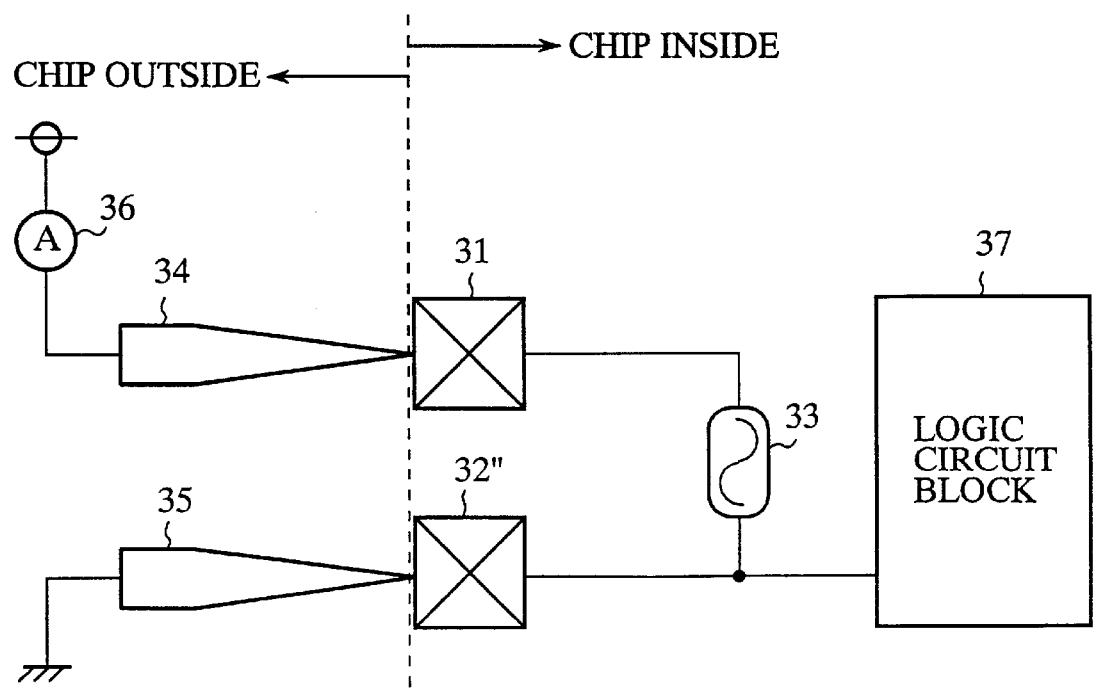
FIG. 16 is a circuit diagram showing configuration of a defective chip recognition circuit unit according to a fourth embodiment of the invention.

FIG. 16 is a circuit diagram showing another configuration of a defective chip recognition circuit unit 2. In FIG. 16, numeral 31 designates a pad provided newly as a defective chip recognition circuit, numeral 32" designates a GND pad previously required, that is, a pad supplying the earth (GND) potential to a logic circuit block 37 at the inside, and numeral 36 designates an ammeter. Numeral 33 designates a fuse, and one end of the fuse 33 is connected to a pad provided newly as a defective chip recognition circuit and other end thereof is constituted to the GND wiring within the chip. Also numerals 34, 35 designate one of the wafer test probe (needle) contacting with the pads 31, 32" respectively.

Circuit configuration of FIG. 16 receives the earth potential supply from the defective chip recognition circuit unit 2 at the chip outside through the logic circuit block 37 at the chip inside, and is equivalent to the second embodiment. A current flowing through resistance is measured, and decision is effected whether the fuse is blown out or not.

As above described, according to the fourth embodiment, since the test flow in the first embodiment can be realized, the test time can be reduced and also one end of the defective chip recognition fuse is connected to the GND wiring within the chip, and an effect can be obtained that the number of pad can be reduced.

What is claimed is:

1. A semiconductor integrated circuit device comprising:
   a semiconductor substrate;
   a dynamic random access memory (DRAM) unit and a logic unit on said semiconductor substrate and connected to each other; and
   a defective chip recognition circuit unit located on a surface of said semiconductor substrate so that, during testing of said DRAM unit, if said DRAM unit cannot be conformed, even by using a redundancy circuit, to a specification, data indicating a defect can be written into said defective chip recognition circuit unit.

2. The semiconductor integrated circuit device as set forth in claim 1, wherein said defective chip recognition circuit unit has a defective chip recognition fuse and two pads connected externally to opposite ends of said defective chip recognition fuse.

3. The semiconductor integrated circuit device as set forth in claim 1, wherein said defective chip recognition circuit unit has a defective chip recognition fuse and two pads connected externally to opposite ends of said defective chip recognition fuse, and one of said ends is also connected to a power source wiring within said chip.

4. The semiconductor integrated circuit device as set forth in claim 1, wherein said defective chip recognition circuit unit has a defective chip recognition fuse and two pads connected externally to opposite ends of said defective chip recognition fuse, and one of said ends is also connected to an AND wiring within said chip.

5. The semiconductor integrated circuit device as set forth in claim 2, including a redundancy fuse in said DRAM unit, wherein said redundancy fuse and said defective chip recognition fuse are the same material.

6. The semiconductor integrated circuit device as set forth in claim 5, wherein said redundancy fuse and said defective chip recognition fuse are the same material and formed in the same process.

* * * * *